United States Patent
Lima (10) Patent No.: US 12,151,215 B2
(45) Date of Patent: Nov. 26, 2024

(54) NANOFIBER FILTERED FILMS AND SOLUBLE SUBSTRATE PROCESSING

(71) Applicant: LINTEC OF AMERICA, INC., Richardson, TX (US)

(72) Inventor: Marcio D. Lima, Richardson, TX (US)

(73) Assignee: LINTEC OF AMERICA, INC., Plano, TX (US)

( * ) Notice: Subject to any disclaimer, the term of this patent is extended or adjusted under 35 U.S.C. 154(b) by 471 days.

(21) Appl. No.: 17/770,812

(22) PCT Filed: Oct. 23, 2020

(86) PCT No.: PCT/US2020/057110
§ 371 (c)(1),
(2) Date: Apr. 21, 2022

(87) PCT Pub. No.: WO2021/081361
PCT Pub. Date: Apr. 29, 2021

(65) Prior Publication Data
US 2022/0363543 A1  Nov. 17, 2022

Related U.S. Application Data

(60) Provisional application No. 62/993,030, filed on Mar. 22, 2020, provisional application No. 62/925,533, filed on Oct. 24, 2019.

(51) Int. Cl.
*B01D 71/02* (2006.01)
*B01D 67/00* (2006.01)
(Continued)

(52) U.S. Cl.
CPC ... *B01D 71/0212* (2022.08); *B01D 67/00412* (2022.08); *B23K 26/38* (2013.01);
(Continued)

(58) Field of Classification Search
CPC .......... B01D 71/0212; B01D 67/00412; B01D 67/00416; B01D 2323/64; B01D 69/122;
(Continued)

(56) References Cited

U.S. PATENT DOCUMENTS

| 10,196,271 B2 | 2/2019 | Zhang et al. | |
| 2012/0100203 A1* | 4/2012 | Fang | D01F 9/12 |
| | | | 423/580.1 |

(Continued)

FOREIGN PATENT DOCUMENTS

| CN | 101437663 | 6/2013 | |
| JP | 2015-086094 | * 5/2015 | ............. C01B 31/02 |

(Continued)

OTHER PUBLICATIONS

Written Opinion of the International Searching Authority in PCT/US20/57110, mailed Jan. 25, 2021 (Year: 2021).*

(Continued)

*Primary Examiner* — Daniel C. McCracken
(74) *Attorney, Agent, or Firm* — GREENBLUM & BERNSTEIN, P.L.C.

(57) ABSTRACT

An apparatus and method for transferring nanofiber structures (e.g., nanofiber films, nanofiber sheets, stacks of nanofiber grids, nanofiber films, nanofiber sheets, and combinations thereof) between various substrates are described. The techniques described use a soluble layer on a substrate that is subsequently dissolved, thus freeing the nanofiber structure from the substrate. This liquid phase techniques preserves the mechanical integrity and the purity of the nanofiber structures.

20 Claims, 10 Drawing Sheets

(51) Int. Cl.
  *B23K 26/38* (2014.01)
  *B82Y 30/00* (2011.01)
  *B82Y 40/00* (2011.01)
  *C01B 32/168* (2017.01)
  *D01F 9/127* (2006.01)
  *D04H 1/4242* (2012.01)
  *D04H 1/732* (2012.01)
  *G03F 1/62* (2012.01)

(52) U.S. Cl.
  CPC ............ *C01B 32/168* (2017.08); *D01F 9/127* (2013.01); *D04H 1/4242* (2013.01); *D04H 1/732* (2013.01); *G03F 1/62* (2013.01); *B82Y 30/00* (2013.01); *B82Y 40/00* (2013.01); *C01P 2004/02* (2013.01); *C01P 2004/03* (2013.01)

(58) Field of Classification Search
  CPC ..... B23K 26/38; C01B 32/168; C01B 32/158; C01B 32/159; C01B 32/16; C01B 32/162; C01B 32/164; C01B 32/166; C01B 32/17; C01B 32/172; C01B 32/174; C01B 32/176; C01B 32/178; C01B 2202/00; C01B 2202/02; C01B 2202/04; C01B 2202/06; C01B 2202/08; C01B 2202/10; C01B 2202/20; C01B 2202/22; C01B 2202/24; C01B 2202/26; C01B 2202/28; C01B 2202/30; C01B 2202/32; C01B 2202/34; C01B 2202/36; D01F 9/127; D01F 9/12; D01F 9/1271; D01F 9/1272; D01F 9/1273; D01F 9/1274; D01F 9/1275; D01F 9/1276; D01F 9/1277; D01F 9/1278; D01F 9/133; D04H 1/4242; D04H 1/732; G03F 1/62; B82Y 30/00; B82Y 40/00; C01P 2004/02; C01P 2004/03

See application file for complete search history.

(56) References Cited

U.S. PATENT DOCUMENTS

| | | |
|---|---|---|
| 2019/0218099 A1 | 7/2019 | Huynh |
| 2019/0346703 A1 | 11/2019 | Lee |
| 2023/0051993 A1* | 2/2023 | Xu .................. B44C 1/1752 |

FOREIGN PATENT DOCUMENTS

| | | | |
|---|---|---|---|
| WO | 2007/015710 A2 | 2/2007 | |
| WO | WO 2007/015710 | * 2/2007 | ............ B29C 47/04 |
| WO | 2015/172050 A2 | 11/2015 | |
| WO | 2017/180137 A1 | 10/2017 | |
| WO | 2018/161116 | 9/2018 | |
| WO | 2018/161116 A1 | 9/2018 | |

OTHER PUBLICATIONS

A. Szabo et al., ""Wash and go": sodium chloride as an easily removable catalyst support for the synthesis of carbon nanotubes", PhysChemComm, vol. 6, No. 10, 2003, pp. 40-41.

International Search Report issued in International Patent Application No. PCT/US2020/057110, dated Jan. 25, 2021.

Taiwanese Office Action dated Apr. 12, 2024 issued in Taiwanese patent application No. 109136430 and including a search report, and corresponding English translation.

Japanese Office Action dated Sep. 17, 2024 issued in Japanese Patent Application No. 2022-523503 along with corresponding English translation.

* cited by examiner

FIG. 1

Nanofiber forest

FIG. 2

Example reactor for growing nanofibers

NANOFIBER FILTERED FILMS AND SOLUBLE SUBSTRATE PROCESSING

RELATED APPLICATIONS

This application claims priority under 35 USC § 119(e) to U.S. Provisional Patent Application No. 62/925,533 entitled "NANOFIBER FILTERED FILMS AND WATER SOLUBLE GRID PROCESSING," filed on Oct. 24, 2019, and U.S. Provisional Patent Application No. 62/993,030 entitled "NANOFIBER FILTERED FILMS AND WATER SOLUBLE GRID PROCESSING," filed on Mar. 22, 2020, each of which is incorporated by reference herein in their entirety.

TECHNICAL FIELD

The present disclosure relates generally to nanofibers. Specifically, the present disclosure relates to nanofiber filtered films and soluble substrate processing.

BACKGROUND

Nanofibers are known to have unusual mechanical, optical, and electronic properties. However, devising configurations of nanofibers that can be integrated into commercial products has been challenging because of the nanoscale dimensions of the nanofibers. One example of an advance in developing commercially useful embodiments of nanofibers is the fabrication of a nanofiber "forest." This forest is an array of parallel nanofibers grown perpendicular to a substrate surface. The forest can be drawn from the substrate into a nanofiber sheet into a nanofiber sheet in which the nanofibers are parallel to one another and within the plane of the sheet. Nanofiber sheets can then optionally be formed into nanofiber yarns. Nanofibers may alternatively be suspended in a solvent and then applied to a filter. As the solvent is removed through the solvent-permeable filter, a film of randomly oriented nanofibers remains on one side of the filter, which is impermeable to nanofibers.

SUMMARY

In a first example, a method includes preparing a nanofiber structure on a substrate assembly, the substrate assembly including a substrate layer and a soluble layer, dissolving the soluble layer with a solvent, in response to the dissolving, floating the nanofiber structure on a surface of the solvent, and causing detachment of the nanofiber structure from the substrate layer as the nanofiber structure is submerged into the solvent.

Example 2 includes the subject matter of Example 1, and further includes removing the floating nanofiber structure from the surface of the solvent.

Example 3 includes the subject matter of Example 1, wherein the soluble layer is sodium chloride and the solvent is water.

Example 4 includes the subject matter of Example 1, wherein the soluble layer is a polymer and the solvent is an organic solvent.

Example 5 includes the subject matter of Example 1, and further includes cutting the nanofiber structure with an infrared laser before the dissolving.

Example 6 includes the subject matter of Example 1, wherein the substrate layer comprises one or more of glass, silica, silicon, polymer, and steel.

Example 7 includes the subject matter of Example 1, wherein a thickness of the soluble layer is between 10 µm and 200 µm.

Example 8 includes the subject matter of Example 2, wherein the removing includes using a final substrate to remove the floating nanofiber structure from the surface of the solvent.

Example 9 includes the subject matter of Example 1, wherein the nanofiber structure comprises at least two carbon nanofiber layers.

Example 10 includes the subject matter of Example 9, wherein each of the carbon nanofiber layers comprise at least one of a carbon nanofiber sheet, a carbon nanofiber filtered film, and a carbon nanofiber grid.

Example 11 includes the subject matter of Example 10, and further includes floating the nanofiber structure on the solvent surface following complete detachment from the substrate layer.

Example 12 includes the subject matter of Example 2, wherein the removing includes using a frame to lift the floating nanofiber structure from the surface of the solvent.

Example 13 includes the subject matter of Example 12, wherein the frame is a wire frame comprising an open center portion.

Example 14 is an apparatus including a transparent conductive film comprising a nanofiber structure on a substrate assembly, the substrate assembly including a substrate layer and a soluble layer, wherein the nanofiber structure is configured to float on a surface of a solvent and wherein the soluble layer is configured to be dissolved from the substrate layer by floating the nanofiber structure on the surface of the solvent.

Example 15 includes the subject matter of Example 14, wherein an electrical resistance of the transparent conductive film is less than 1 Ω/sq.

Example 16 includes the subject matter of Example 14, wherein the transparent conductive film is transparent to greater than 99% of visible light.

Example 17 includes the subject matter of Example 14, wherein the soluble layer comprises at least one of sodium chloride, calcium chloride, potassium bromide, starch, polystyrene, and toluene.

Example 18 includes the subject matter of Example 14, wherein the transparent conductive film is configured to be cut using at least one of a laser beam and an electric discharge device without causing damage to the soluble layer.

Example 19 includes the subject matter of Example 14, wherein the nanofiber structure comprises at least two carbon nanofiber layers.

Example 20 includes the subject matter of Example 19, wherein each of the carbon nanofiber layers comprise at least one of a carbon nanofiber sheet, a carbon nanofiber filtered film, and a carbon nanofiber grid.

The figures depict various embodiments of the present disclosure for purposes of illustration only. Numerous variations, configurations, and other embodiments will be apparent from the following detailed discussion. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Overview

Nanofibers often have unusual and interesting properties that are not present in similarly composed bulk materials. However, because of the nanoscopic dimensions of individual nanofibers, some nanofiber-based materials can be challenging to work with. For example, carbon nanofiber sheets, while possessing may interesting properties, are physically delicate and can be torn, folded, or otherwise damaged during processing by even the most subtle forces. Air flows caused by air handling equipment or the breath of an operator can sometimes damage nanofiber sheet. Because of this physically delicate nature, some development efforts are focused not only on exploring and applying the unusual properties of nanofiber materials, but also on improving the processing of these materials.

Techniques described herein include methods for transferring nanofiber structures (e.g., nanofiber films, nanofiber sheets, stacks of nanofiber grids, nanofiber films, nanofiber sheets, and combinations thereof) between various substrates. The techniques described herein enable this transferring using liquid phase techniques that preserve the mechanical integrity of the nanofiber structures and the purity of the nanofiber structures. In other words, despite the delicate nature of nanofiber structures, the techniques described herein neither damage nor contaminate the nanofiber structures.

Prior to descriptions of these arrays and the methods for producing the arrays, descriptions of nanofibers, nanofiber filtered films, and nanofiber forests and sheets follows.

Nanofiber Forests

As used herein, the term "nanofiber" means a fiber having a diameter less than 1 μm. While the embodiments herein are primarily described as fabricated from carbon nanotubes, it will be appreciated that other carbon allotropes, whether graphene, micron or nano-scale graphite fibers and/or plates, and even other compositions of nano-scale fibers such as boron nitride may be processed using the techniques described below. As used herein, the terms "nanofiber" and "nanotube" are used interchangeably and encompass both single wall nanotubes, few wall nanotubes and/or multiwall nanotubes in which atoms are linked together to form a cylindrical structure. In some embodiments, multiwall nanotubes as referenced herein have between 6 and 20 walls.

The dimensions of nanotubes can vary greatly depending on production methods used. For example, the diameter of a carbon nanotube may be from 0.4 nm to 100 nm and its length may range from 10 μm to greater than 55.5 cm. Carbon nanotubes are also capable of having very high aspect ratios (ratio of length to diameter) with some as high as 132,000,000:1 or more. Given the wide range of dimensional possibilities, the properties of carbon nanotubes are highly adjustable, or "tunable." While many intriguing properties of carbon nanotubes have been identified, harnessing the properties of carbon nanotubes in practical applications requires scalable and controllable production methods that allow the features of the carbon nanotubes to be maintained or enhanced.

Due to their unique structure, nanotubes possess particular mechanical, electrical, chemical, thermal and optical properties that make them well-suited for certain applications. In particular, carbon nanotubes exhibit superior electrical conductivity, high mechanical strength, good thermal stability and are also hydrophobic. In addition to these properties, carbon nanotubes may also exhibit useful optical properties. For example, carbon nanotubes may be used in light-emitting diodes (LEDs) and photo-detectors to emit or detect light at narrowly selected wavelengths. Carbon nanotubes may also prove useful for photon transport and/or phonon transport.

Figure 1:
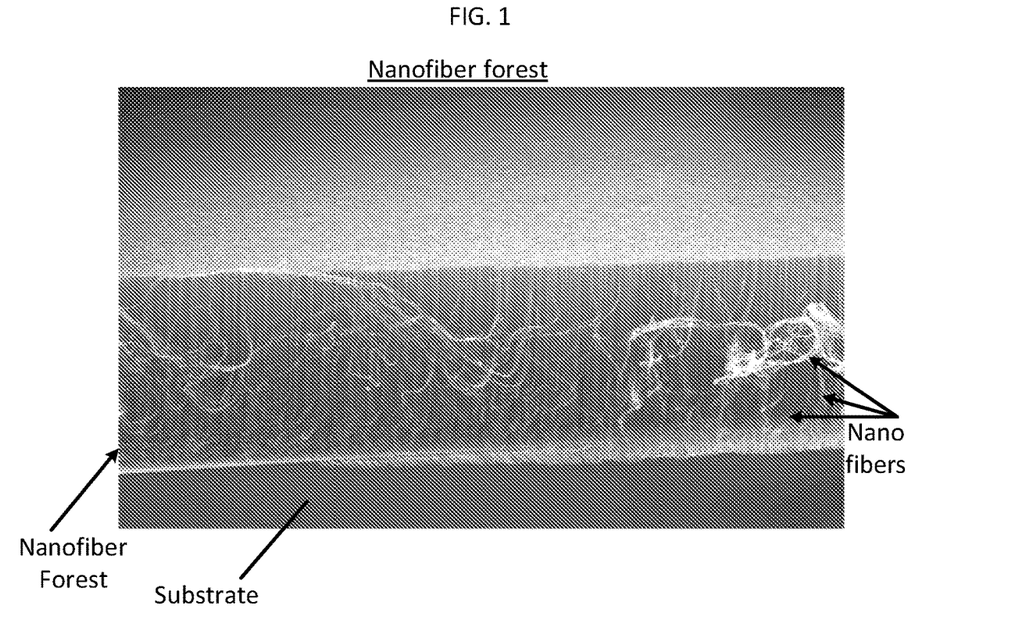
FIG. 1 is a photomicrograph of an example forest of nanofibers on a substrate, in an embodiment.

In accordance with various embodiments of the subject disclosure, nanofibers (including but not limited to carbon nanotubes) can be arranged in various configurations, including in a configuration referred to herein as a "forest." As used herein, a "forest" of nanofibers or carbon nanotubes refers to an array of nanofibers having approximately equivalent dimensions that are arranged substantially parallel to one another on a substrate. FIG. 1 shows an example forest of nanofibers on a substrate. The substrate may be any shape but in some embodiments the substrate has a planar surface on which the forest is assembled. As can be seen in FIG. 1, the nanofibers in the forest may be approximately equal in height and/or diameter.

Nanofiber forests as disclosed herein may be relatively dense. Specifically, the disclosed nanofiber forests may have a density of at least 1 billion nanofibers/cm$^2$. In some specific embodiments, a nanofiber forest as described herein may have a density of between 10 billion/cm$^2$ and 30 billion/cm$^2$. In other examples, the nanofiber forest as described herein may have a density in the range of 90 billion nanofibers/cm$^2$. The forest may include areas of high density or low density and specific areas may be void of nanofibers. The nanofibers within a forest may also exhibit inter-fiber connectivity. For example, neighboring nanofibers within a nanofiber forest may be attracted to one another by van der Waals forces. Regardless, a density of nanofibers within a forest can be increased by applying techniques described herein.

Methods of fabricating a nanofiber forest are described in, for example, PCT No. WO2007/015710, which is incorporated herein by reference in its entirety.

Figure 2:
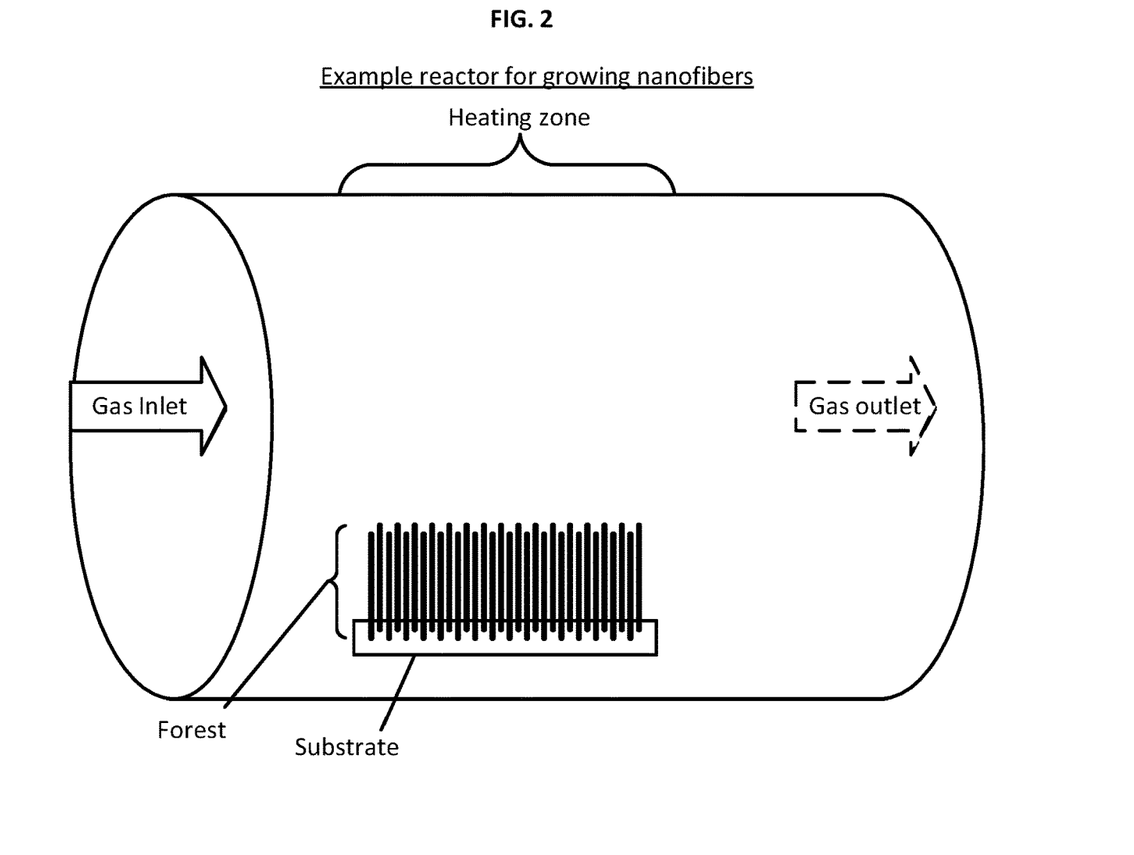
FIG. 2 is a schematic illustration of an example reactor for nanofiber growth, in an embodiment.

Various methods can be used to produce nanofiber precursor forests. For example, in some embodiments nanofibers may be grown in a high-temperature furnace, schematically illustrated in FIG. 2. In some embodiments, catalyst may be deposited on a substrate, placed in a reactor and then may be exposed to a fuel compound that is supplied to the reactor. Substrates can withstand temperatures of greater than 800° C. or even 1000° C. and may be inert materials. The substrate may comprise stainless steel or aluminum disposed on an underlying silicon (Si) wafer, although other ceramic substrates may be used in place of the Si wafer (e.g., alumina, zirconia, $SiO_2$, glass ceramics). In examples where the nanofibers of the precursor forest are carbon nanotubes, carbon-based compounds, such as acetylene may be used as fuel compounds. After being introduced to the reactor, the fuel compound(s) may then begin to accumulate on the catalyst and may assemble by growing upward from the substrate to form a forest of nanofibers. The reactor also may include a gas inlet where fuel compound(s) and carrier gasses may be supplied to the reactor and a gas outlet where expended fuel compounds and carrier gases may be released from the reactor. Examples of carrier gases include hydrogen, argon, and helium. These gases, in particular hydrogen, may also be introduced to the reactor to facilitate growth of the nanofiber forest. Additionally, dopants to be incorporated in the nanofibers may be added to the gas stream.

In a process used to fabricate a multilayered nanofiber forest, one nanofiber forest is formed on a substrate followed by the growth of a second nanofiber forest in contact with the first nanofiber forest. Multi-layered nanofiber forests can be formed by numerous suitable methods, such as by forming a first nanofiber forest on the substrate, depositing catalyst on the first nanofiber forest and then introducing additional fuel compound to the reactor to encourage growth of a second nanofiber forest from the catalyst positioned on the first nanofiber forest. Depending on the growth methodology applied, the type of catalyst, and the location of the catalyst, the second nanofiber layer may either grow on top of the first nanofiber layer or, after refreshing the catalyst, for example with hydrogen gas, grow directly on the substrate thus growing under the first nanofiber layer. Regardless, the second nanofiber forest can be aligned approximately end-to-end with the nanofibers of the first nanofiber forest although there is a readily detectable interface between the first and second forest. Multi-layered nanofiber forests may include any number of forests. For example, a multi-layered precursor forest may include two, three, four, five or more forests.

Figure 3:
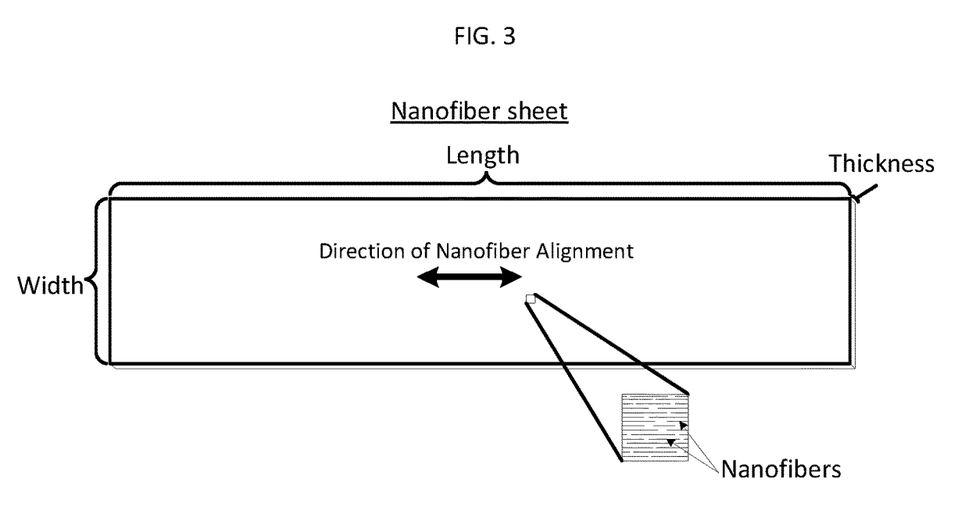
FIG. 3 is an illustration of a nanofiber sheet that identifies relative dimensions of the sheet and schematically illustrates nanofibers within the sheet aligned end-to-end in a plane parallel to a surface of the sheet, in an embodiment.

In addition to arrangement in a forest configuration, the nanofibers of the present application may also be arranged in a sheet configuration. As used herein, the term "nanofiber sheet," "nanotube sheet," or simply "sheet" refers to an arrangement of nanofibers where the nanofibers are aligned end to end in a plane. As used herein, a "nanofiber sheet" or simply "sheet" refers to a sheet of nanofibers aligned via a drawing process (as described in PCT Publication No. WO 2007/015710, and incorporated by reference herein in its entirety) so that a longitudinal axis of a nanofiber of the sheet is parallel to a major surface of the sheet, rather than perpendicular to the major surface of the sheet (i.e., in the as-deposited form of the sheet, often referred to as a "forest"). An illustration of an example nanofiber sheet is shown in FIG. 3 with labels of the dimensions. In some embodiments, the sheet has a length and/or width that is more than 100 times greater than the thickness of the sheet. In some embodiments, the length, width or both, are more than $10^3$, $10^6$ or $10^9$ times greater than the average thickness of the sheet. A nanofiber sheet can have a thickness of, for example, between approximately 5 nm and 30 μm and any length and width that are suitable for the intended application. In some embodiments, a nanofiber sheet may have a length of between 1 cm and 10 meters and a width between 1 cm and 1 meter. These lengths are provided merely for illustration. The length and width of a nanofiber sheet are constrained by the configuration of the manufacturing equipment and not by the physical or chemical properties of any of the nanotubes, forest, or nanofiber sheet. For example, continuous processes can produce sheets of any length. These sheets can be wound onto a roll as they are produced.

As can be seen in FIG. 3, the axis in which the nanofibers are aligned end-to end is referred to as the direction of nanofiber alignment. In some embodiments, the direction of nanofiber alignment may be continuous throughout an entire nanofiber sheet. Nanofibers are not necessarily perfectly parallel to each other and it is understood that the direction of nanofiber alignment is an average or general measure of the direction of alignment of the nanofibers.

Nanofiber sheets may be assembled using any type of suitable process capable of producing the sheet. In some example embodiments, nanofiber sheets may be drawn from a nanofiber forest. An example of a nanofiber sheet being drawn from a nanofiber forest is shown in FIG. 4

Figure 4:
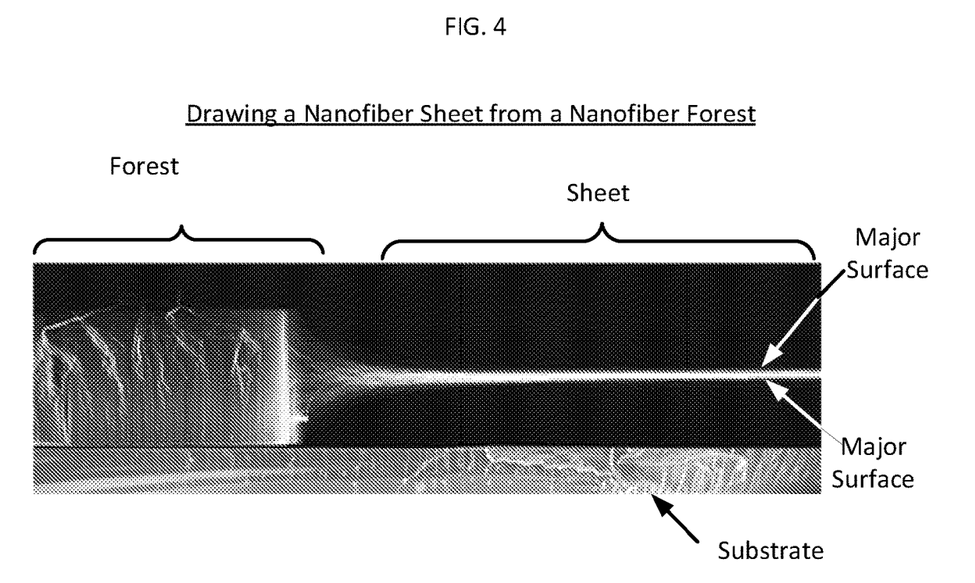
FIG. 4 is an SEM photomicrograph is an image of a nanofiber sheet being laterally drawn from a nanofiber forest, the nanofibers aligning from end-to-end as schematically, in an embodiment.

As can be seen in FIG. 4, the nanofibers may be drawn laterally from the forest and then align end-to-end to form a nanofiber sheet. In embodiments where a nanofiber sheet is drawn from a nanofiber forest, the dimensions of the forest may be controlled to form a nanofiber sheet having particular dimensions. For example, the width of the nanofiber sheet may be approximately equal to the width of the nanofiber forest from which the sheet was drawn. Additionally, the length of the sheet can be controlled, for example, by concluding the draw process when the desired sheet length has been achieved.

Nanofiber sheets have many properties that can be exploited for various applications. For example, nanofiber sheets may have tunable opacity, high mechanical strength and flexibility, thermal and electrical conductivity, and may also exhibit hydrophobicity. Given the high degree of alignment of the nanofibers within a sheet, a nanofiber sheet may be extremely thin. In some examples, a nanofiber sheet is on the order of approximately 10 nm thick (as measured within normal measurement tolerances), rendering it nearly two-dimensional. In other examples, the thickness of a nanofiber sheet can be as high as 200 nm or 300 nm. As such, nanofiber sheets may add minimal additional thickness to a component.

As with nanofiber forests, the nanofibers in a nanofibers sheet may be functionalized by a treatment agent by adding chemical groups or elements to a surface of the nanofibers of the sheet and that provide a different chemical activity than the nanofibers alone. Functionalization of a nanofiber sheet can be performed on previously functionalized nanofibers or can be performed on previously unfunctionalized nanofibers. Functionalization can be performed using any of the techniques described herein including, but not limited to CVD, and various doping techniques.

Nanofiber sheets, as drawn from a nanofiber forest, may also have high purity, wherein more than 90%, more than 95% or more than 99% of the weight percent of the nanofiber sheet is attributable to nanofibers, in some instances. Similarly, the nanofiber sheet may comprise more than 90%, more than 95%, more than 99% or more than 99.9% by weight of carbon.

Filtered Nanofiber Films

Another planar form of assembled nanofibers is a "filtered film," in which one or more of multiwall nanotubes, few wall nanotubes, and/or single wall nanotubes are dispersed in a solvent as a suspension (the nanofibers being insoluble in the solvent). This dispersion can subsequently be formed into a solid-state film of carbon nanotubes that are randomly oriented relative to one another in the plane of the film. In some cases, the dispersion is such that a majority of nanotubes are suspended individually and not adsorbed onto other nanotubes. The greater the degree of dispersion (e.g., the few nanotubes are adsorbed on to one another in the solvent), the more uniform (i.e., uniform thickness) a subsequently formed nanofiber film can be. This physical uniformity (in some examples, further improved by stacking multiple filtered films on one another) can also improve the uniformity of the properties across the film (e.g., transparency to radiation).

For the purposes of clarity, multiwall nanotubes are considered to have from 4 to 20 concentric walls and a diameter of from 4 nm to 100 nm; few wall nanotubes are considered to have two or three concentric walls and a diameter of from 2 nm to 6 nm; and single wall carbon nanotubes are considered to have 1 wall and a tube diameter of from 0.2 nm to 4 nm.

Each of these three different types of nanotubes can have different properties. In one example, few wall carbon nanotubes and single wall carbon nanotubes can be more conveniently dispersed in a solvent (i.e., with the majority of nanotubes suspended individually and not adsorbed onto other nanotubes) for subsequent formation into a sheet of randomly oriented carbon nanotubes. This ability of individual nanotubes to be uniformly dispersed in a solvent can in turn produce a dimensionally uniform nanotube filtered film formed by removing the solvent from the suspended nanofibers.

The strength of van der Waals attraction between nanofibers also differs between single/few wall nanofibers and multiwall nanofibers. Generally, single/few wall nanofibers have a greater van der Waals attraction to each other than that observed for multiwall nanofibers. This increased attraction between single/few wall nanofibers can improve the ability of few/single wall carbon nanotubes to adhere to one another to form a coherent nanofiber structure, such as a filtered film.

The sheets or films formed from single wall carbon nanotubes and few wall carbon nanotubes are able to conform to a topography of an underlying surface at smaller dimensions than sheets or films formed from multiwall carbon nanotubes. In some examples, sheets or films formed from single wall carbon nanotubes and/or few wall carbon nanotubes can conform to a topography of an underlying substrate as small as 10 nm, which is at least 50% smaller than the feature size a multiwall carbon nanotube film can conform to. In some cases, the multiwall carbon nanotubes are more likely than single/few wall nanotubes to agglomerate together and thereby produce a structurally non-uniform film that is less likely to conform and/or adhere to an underlying surface.

Preparation of a filtered film can begin by preparing a dry mixture of the desired proportion of one or more of multiwall nanotubes, few wall nanotubes, and/or single wall nanotubes. This mixture of one or more of the different types of nanotubes can be then suspended in a solvent. In another example, separate suspensions of known concentrations of nanotubes in a solvent are prepared. For example, separate suspensions of multiwalled carbon nanotubes, few wall carbon nanotubes, and single wall nanotubes can be prepared. The suspensions can then be mixed in a desired proportion to arrive at the desired relative proportions of the multiwall, and few/single wall nanotubes in the combined suspension and ultimately the final filtered film.

The liquid phase of the suspension can be, for example, polar compounds such as polar protic or polar aprotic compounds. In some examples, the solvent used to prepare nanotube suspensions can include water, isopropyl alcohol (IPA), N-Methyl-2-pyrrolidone (NMP), dimethyl sulfide (DMS), and combinations thereof. In some examples a surfactant can also be included to aid the uniform dispersion of carbon nanofibers in the solvent. Example surfactants include, but are not limited to, sodium cholate, sodium dodecyl sulfate (SDS), and sodium dodecyl benzene sulphonate (SDBS). Weight percentage of surfactant in the solvent can be anywhere between 0.1 weight % to 10 wt. % of solvent. In one embodiment, a mixture of 50 wt. % multiwalled carbon nanotubes and 50 wt. % few/single wall carbon nanotubes can be prepared and suspended in water and SDS surfactant. Dispersion of the nanotubes in the solvent can include mechanical mixing (e.g., using a magnetic stir bar and stirring plate), mechanical shaking, ultrasonic agitation (e.g., using an immersion ultrasonic probe) or other means.

As described above, examples described herein can include nanofiber films that can be formed from one type of nanofiber (e.g., single wall, few wall, multiwall) or a combination of these different types of nanofibers. Examples that are composed of more than one type of nanofiber can be described as "composite films" due to the combination or mixture of different nanofiber types. In some examples herein, a multiwalled carbon nanotube length can have a median length of approximately 300 μm (+/−10%). As will be appreciated in light of the following description, multiwalled carbon nanotubes having a length of at least 250 μm or longer can be included in a filtered film to improve the mechanical stability of filtered films that also include single wall and/or few wall carbon nanotubes, which generally are shorter (e.g. from 0.5 μm to 30 μm). Films that are formed exclusively from either the longer multiwalled nanotubes or shorter few/single wall carbon nanotubes are generally not as durable (i.e., resistant to mechanical failure such as cracking or disintegrating) as those that include a mixture of the multiwall and few/single wall nanotubes.

The suspension is applied to a filter that is permeable to the solvent but that is not permeable to the nanofibers. One example filter is that of common laboratory filter paper. Other types of filters may be used as long as they are permeable to solvent and not permeable to nanofibers.

The solvent is then separated from the suspended nanofibers by allowing the solvent to pass through the filter, thus leaving the filtered film on a top surface of the filter. In some examples, the solvent can be separated from the nanofibers (i.e., the solid phase component of the suspension) by simply allowing the solvent to flow through the filter under the force of gravity. In other examples, the solvent can be forcibly drawn or pushed through the filter by selective application of negative pressure (i.e., vacuum) to a side of the filter opposite the applied suspension or positive pressure to a side of the filter with the applied suspension. In some examples, after the separation using the filter, heat may be applied to the filtered film to help remove solvent by drying.

The filtered film can be removed from the filter by immersion in deionized water. Because the nanofiber film is hydrophobic and is merely on (but not bonded to) the filter, the filtered film will naturally lift from the filter to float on a surface of the water. A frame or other substrate can then be used to lift the film from the surface of the water, thus depositing the filtered film on the frame or substrate. If needed, the surface tension of the water (or other solvent) can be modified by adding surfactants or other solvents. The filtered film can then be dried (e.g., using a low humidity environment, heat, vacuum). This process can be repeated to form different films of, optionally, differently composed mixtures of multiwall, few wall, and/or single wall nanofibers.

After removal, the filtered film (or stack of filtered films) can be dried by exposure to a low relative humidity environment, heat, or other drying technique.

Figure 5:
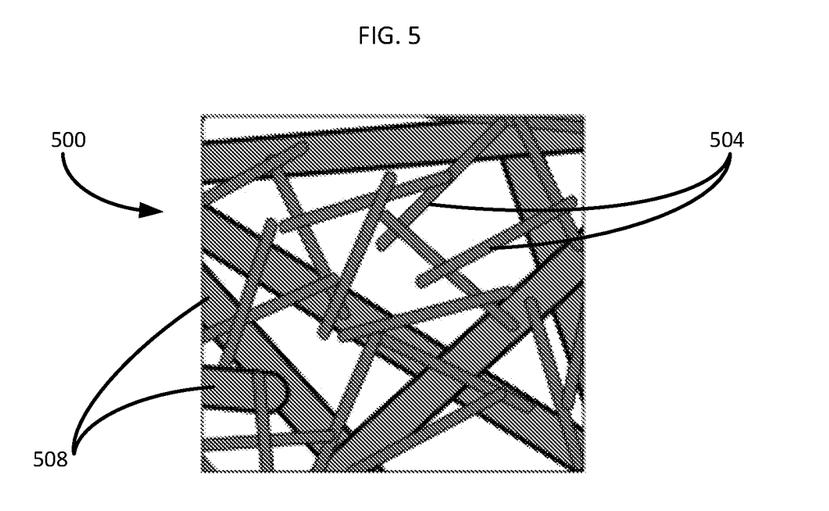
FIG. 5 is a schematic illustration of a portion of a filtered nanofiber film that includes larger and longer multiwall carbon nanofibers intermixed with single wall and/or few wall carbon nanofibers, all of which are randomly oriented within a plane of the film, in an embodiment.

FIG. 5 is a schematic illustration of a composite nanotube filtered film 500, in an example of the present disclosure. As shown, the composite nanotube filtered film 500 includes single/few wall nanotubes 504 that are inter-dispersed with multiwall carbon nanotubes 508. In this example film 500, the single/few wall carbon nanotubes 504 can have at least two beneficial effects on the structure of the film 500 as a whole. For example, the single/few wall carbon nanotubes 504 can increase the number of indirect connections between proximate multiwalled carbon nanotubes 508 by bridging the gaps between proximate multiwalled carbon nanotubes 508. The interconnections between the short and long nanofibers can improve the transfer and distribution of forces applied to the film and thus improve durability. In a second example of a beneficial effect, the single/few wall carbon nanotubes 504 can decrease a median and/or mean size of the gaps between adjacent and/or overlapping multiwall carbon nanotubes 508, which can be advantageous for some embodiments. Furthermore, too many longer multiwalled carbon nanotubes can, when dispersed in a solvent, agglomerate. This can result in a non-uniform film. Shorter nanotubes are more easily dispersed in a solvent and thus are more likely to form a dimensionally uniform film having a uniform density of nanotubes per unit volume.

Figure 6:
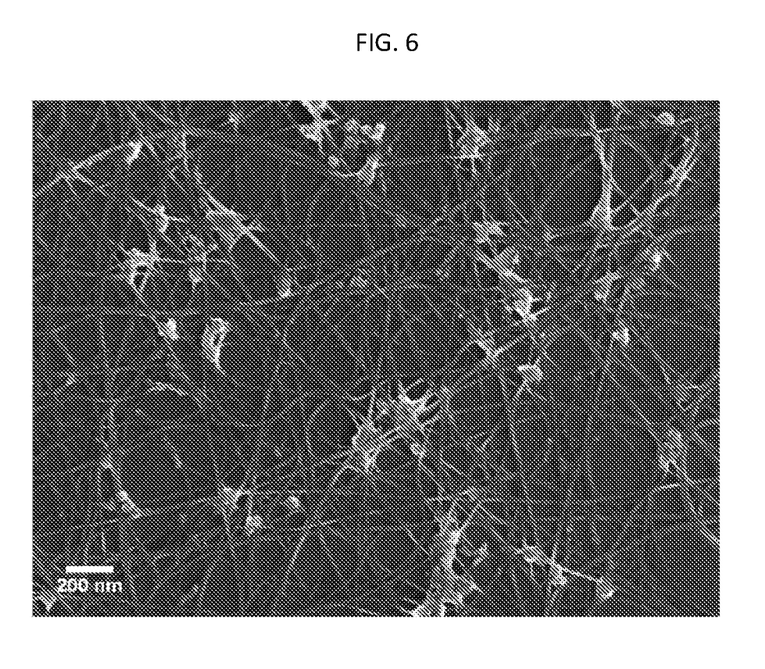
FIG. 6 is an electron microscope image of a filtered film comprising a mixture of multiwall and few wall and/or single wall nanotubes, in an embodiment.

FIG. 6 is an electron microscope image of a filtered film comprising a mixture of multiwall and few wall and/or single wall nanotubes, prepared according the techniques described above.

Properties of Nanofiber Filtered Films

Filtered films, particularly those made with single and/or few wall carbon nanotubes also generally have greater transparency to some wavelengths of radiation. In some examples, transmittance of incident radiation can be as high as 90% or 95%. In some cases, this transmittance is significantly higher than drawn sheets of multiwall carbon nanotubes (such as those drawn from a carbon nanotube forest, described below). While not wishing to be bound by theory, it is believed that the aligned orientation of nanotubes in a drawn sheet increases scattering of the radiation relative to a filtered film. In part, the greater transparency of filtered films (with their randomly oriented nanotubes) has prompted interest in forming transparent filters and pellicles from filtered carbon nanotube films in a variety of applications.

Despite the advantages of single wall carbon nanotubes and few wall carbon nanotubes described above, multiwall carbon nanotubes also have advantages not necessarily observed to the same degree in nanotube structures formed from single or few wall nanotubes. For examples, structures formed from multiwall carbon nanotubes are generally observed to have greater emissivity than those formed from few/single wall carbon nanotubes. While not wishing to be bound by theory, it is believed that the greater number of walls and greater diameter of multiwall carbon nanotubes are factors in the increased emissivity. For example, multiwall carbon nanotube structures (e.g., the nanotube forest, a nanotube sheet) have a greater thermal emissivity than nanotube structures formed from few/single wall nanotubes. In one comparative example, an emissivity of a nanofiber structure comprising multiwall carbon nanotubes is on the order of 0.275 (+/−15%) whereas a nanofiber structure comprising single wall carbon nanotubes can have a significantly lower emissivity of 0.05 (+/−15%). High emissivity can be particularly advantageous in technological applications in which processes can cause heating within the nanofiber structure, but mechanisms of conductive or convective cooling of the nanofiber structure are limited or not technically feasible.

For example, nanofiber structures having transparency to certain wavelengths of radiation (e.g., extreme ultraviolet or "EUV" in the range of 10 nm to 124 nm) have promise for use as a filter (also referred to as a "pellicle") in EUV lithography devices. The pellicle can act as a particle filter that prevents foreign particles from landing on a surface of the material being patterned and/or from landing on a surface of the lithography mask being used to pattern a photoactive surface. This reduces the rate of lithographically introduced defects, thus improving manufacturing yields of the patterned devices.

Despite the high transparency in the EUV radiation wavelength range, challenges remain to adopting nanofiber EUV pellicles. For example, cooling a nanofiber pellicle may be important for preventing overheating of the pellicle due to absorption of EUV energy during lithographic patterning. Elevated temperatures in the pellicle can degrade nanofiber structure integrity. However, the opportunities for convective and or conductive cooling of the nanofiber structure in this environment are low given that EUV lithography is performed in a vacuum and the pellicle is mostly suspended (with peripheral edges being attached to a frame). For this reason, thermal emission is the primary mechanism of cooling of a nanofiber pellicle used for EUV application.

While multiwall carbon nanotube structures generally have a higher emissivity, which would address the problem of cooling in EUV pellicle, multiwall carbon nanotubes when aligned in a drawn sheet also are less transmissive than randomly oriented single/few wall carbon nanofibers in a filtered film. The more transparent (but less emissive) few wall/single wall nanofiber films are often too mechanically delicate to be used as a pellicle. In some cases, because of their relative short lengths (e.g., less than 100 μm), films and sheets made from few wall/single wall nanofibers are fragile and will disintegrate when subjected to pressure cycles (e.g., changes in pressure of +/−1 atmosphere to 2 atmospheres (from atmospheric pressure to vacuum)) commonly used in EUV lithography machines.

In another set of embodiments, the filtered films described herein can form transparent conductive films (TCF). To achieve this, the filtered films can exhibit low electrical resistance and high optical transparency. The TCFs can include single, double or multiple layers of filtered films.

These filtered films can be just single walled CNTs, just few walled, just multi-walled CNTs, or a combination thereof. For example, the weight ratio of single/few walled nanotubes to multi-walled nanotubes in the TFT can be greater than 1:1, greater than 5:1, greater than 10:1, greater than 50:1, greater than 100:1, less than 1:1, less than 1:2, less than 1:5, less than 1:10, less than 1:20, less than 1:50 or less than 1:100. In various embodiments the TCFs can be constructed to have an electrical resistance of less than 10,000, less than 1,000, less than 100, less than 10 or less than 1.0 Ω/sq. In the same, or different embodiments, the transparency of the films in the visible range can be greater than 60%, greater than 75%, greater than 90%, greater than 95%, greater than 98% or greater than 99%.

These low resistance levels and high transparency can be achieved with or without coating the nanotubes, such as with conductive silver. In some embodiments, the results are achieved without employing Indium. The filtered films can be on one or more substrates or may be free of substrate. The films are able to conform to many shapes and may be adhered to, or used in conjunction with, surfaces such as optical sensors, lenses and windows.

Nanofiber Film Processing with Soluble Substrates

In some cases, using a substrate having a soluble layer on an exposed surface of the substrate can facilitate processing of nanofiber structures, particularly those nanofiber structures that include multiple layers. For example, nanofiber structures that include one or more of a nanofiber sheet, a nanofiber grid, and/or a nanofiber film can be fragile. Removing the nanofiber structure from a substrate using a water soluble layer can improve the convenience with which these delicate structures are removed from one substrate and optionally placed on a final substrate.

FIGS. 7A-7C and 8A-8K illustrate various stages of an example process for using a substrate with a soluble layer to facilitate transfer of a nanofiber substrate. While the following examples are primarily described in terms of a water soluble layer of NaCl, it will be appreciated that other water soluble compositions may be used, including other inorganic salts such as CaCl, and KBr, starch or even other combinations of non-water solvents and corresponding soluble compositions (e.g., polystyrene and toluene). For reasons described below, the soluble layer can also be selected for its transparency to some wavelengths of radiation, in particular those used in lasers. In this way, when using a laser to cut a nanofiber structure on the water soluble layer, the laser does not heat or degrade the underlyingly water soluble layer. The advantage of water and NaCl in particular is that both can be removed from the nanofiber structure and the NaCl is transparent to some wavelengths of laser infrared radiation used to cut nanofiber structures. In other cases, it may be desired to, for example, infiltrate the nanofiber structure with a polymer and thus using a polymer layer on the substrate with a corresponding organic solvent may be the preferred combination.

Figure 7A:
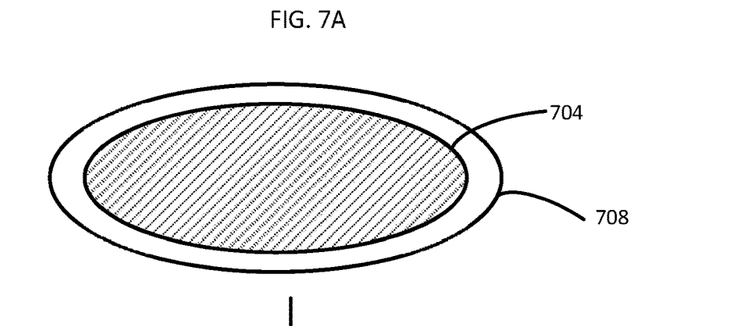
FIGS. 7A, 7B, and 7C illustrate an example process by which a nanofiber filtered film can be removed from a filter by insertion into water, in an embodiment.
Figure 7B:
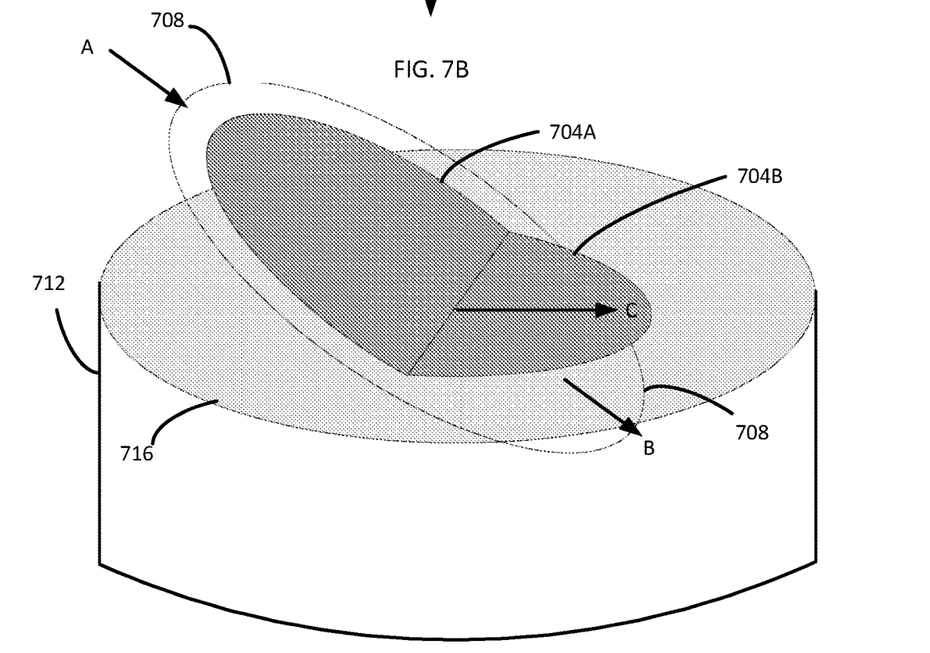
Figure 7C:
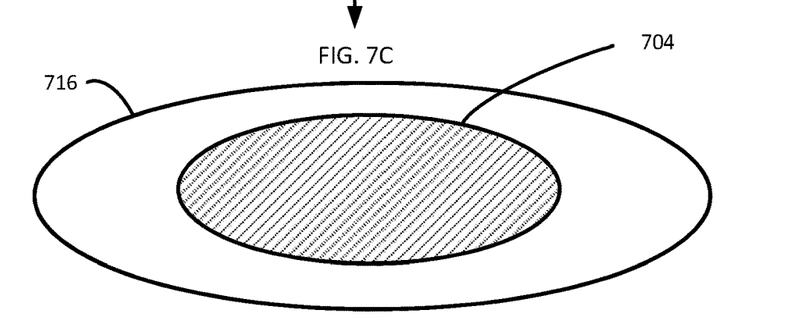

Turning first to FIG. 7A, a nanofiber structure 704 can be placed on a substrate 708. In one example, the nanofiber structure 704 can be a filtered nanofiber film and the substrate 708 can be a glass substrate, a polymer substrate, or filter paper. In some examples, the substrate 708 need not even be planar, but instead can have a convex or concave shape. This is because the techniques described below can be used to remove nanofiber structures from substrates that have these topographies. As shown in FIG. 7B, the nanofiber film 704 and the substrate 708 can be immersed into a container of water 712 (as indicated by arrow "A") and below a surface 716 of the water (as indicated by arrow "B"). As described above, the portion of the filtered nanofiber film 704B in contact with the water floats on the water surface 716. While the portion of the filtered nanofiber film 704B is above the water surface, it remains attached to the substrate 708. However, it too detaches from the substrate 708 as it comes into contact with the water surface 716 (as indicated by arrow "C"). As shown in FIG. 7C, the filtered film 704 will float on the water surface 716 upon being completely detached from the substrate 708.

Figure 8A:
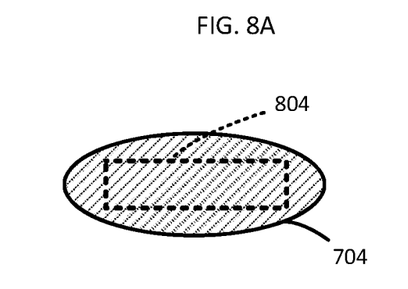
FIGS. 8A-8K illustrate various stages of an example process by which a nanofiber structure including one or more of a nanofiber fiber sheet, a nanofiber filtered film, a nanofiber grid, and combinations thereof is transferred between substrates using a substrate assembly that includes a water soluble layer, in an embodiment.

Turning now to FIG. 8A, the nanofiber structure 704 can be lifted from the water using a frame 804. The frame 804 is shown in FIG. 8A as dashed lines to indicate its location under the nanofiber structure 704. In some examples, the frame can be a wire frame in which the center portion is empty, thus leaving a corresponding portion of the nanofiber film 704 self-supporting and further improving the convenience with which the nanofiber structure can be removed from the frame 804.

Figure 8B:
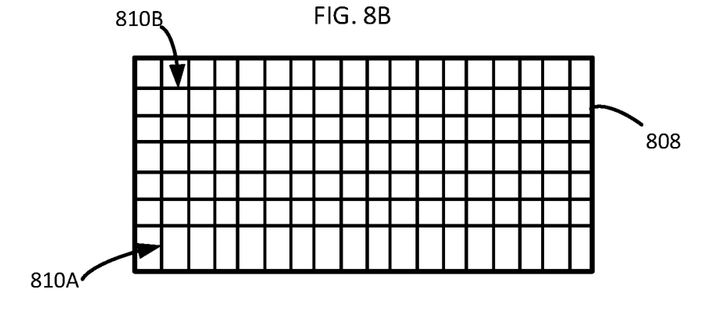

FIG. 8B illustrates a nanofiber grid 808 that can be fabricated according to methods described in U.S. patent application Ser. No. 16/242,086 (corresponding to US PATENT PUBLICATION NO. US2019/0218099), incorporated by reference herein in its entirety. As schematically illustrated, the nanofiber grid 808 includes bundles of nanofibers, separated by gaps defined there between, that are arranged in a transverse orientation. The nanofiber grid 808 is shown with orthogonal vertical nanofiber bundles 810A and horizontal nanofiber bundles 810B. This depiction is for convenience of illustration only and it will be appreciated that the bundles 810A, 810B can be uniformly or irregularly oriented relative to one another in any orientation.

Figure 8C:
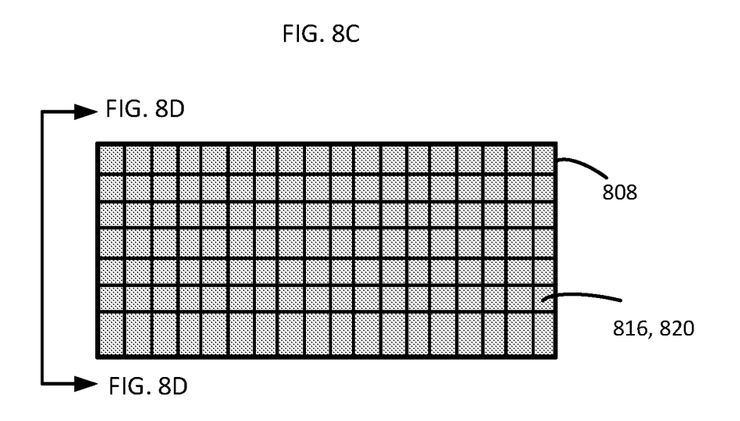
Figure 8D:
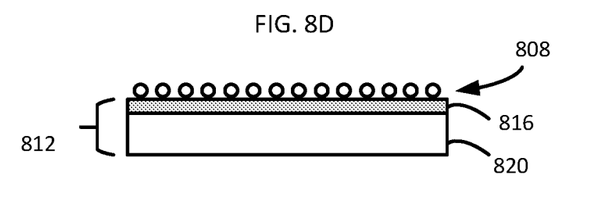

Turning to FIGS. 8C and 8D, the nanofiber grid 808 can be placed on a substrate assembly 812, which includes a substrate 820 and a soluble layer 816 on the substrate 820. Examples of the substrate 820 include, but are not limited to, glass (e.g., borosilicate glass), silica ($SiO_2$), silicon (Si) wafer, polymer sheets (e.g., polycarbonate, polyethylene), steel, among others. The soluble layer 816, as indicated above, can be any of a number of soluble materials. In this example, the soluble layer 816 is a layer of NaCl from 25 microns (μm) to 100 μm thick. In this example, the soluble layer 816 can be sprayed as a saturated solution of water and NaCl onto the substrate 820. The substrate 820 can be heated or pre-heated to facilitate evaporation of the water from the sprayed solution and formation of the soluble layer 816. It will be appreciated that other deposition techniques can be used for this combination of solute (used to form the soluble layer 816) and solvent as well as other techniques. For example, in the case of both a NaCl/water solution as well as polymer/organic solvent solutions, drip casting and/or spin casting can be used instead of (or in addition to) spray casting. Generally, the soluble layer 816 will be between 10 μm and 200 μm thick. The thickness can be customized based on a concentration of solute in solvent in the drip, spin, or spray casted solution as well as the amount of solution applied to the substrate 820.

Figure 8E:
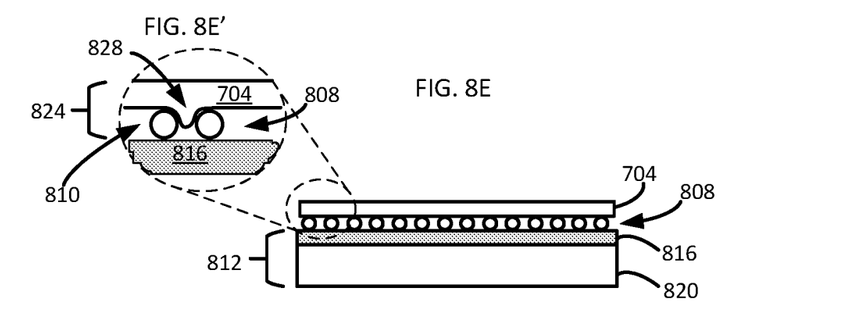

As shown in FIGS. 8E and 8E', the filtered film 704 can be placed on the nanofiber grid 808 on the substrate assembly 812. The stack of the filtered film 704 on the nanofiber grid 808 forms a nanofiber structure assembly 824. As indicated above, the nanofiber structure assembly 824 can formed from any combination and of any number of nanofiber sheets, nanofiber filtered films, and nanofiber grids. In the example shown, it will be appreciated that the nanofiber film 704 may sag between adjacent bundles 810A, 810B (collectively and generically 810) of the nanofiber grid 808. The sagging portion is indicated in FIG. 8E' as salient portion 828.

Figure 8F:
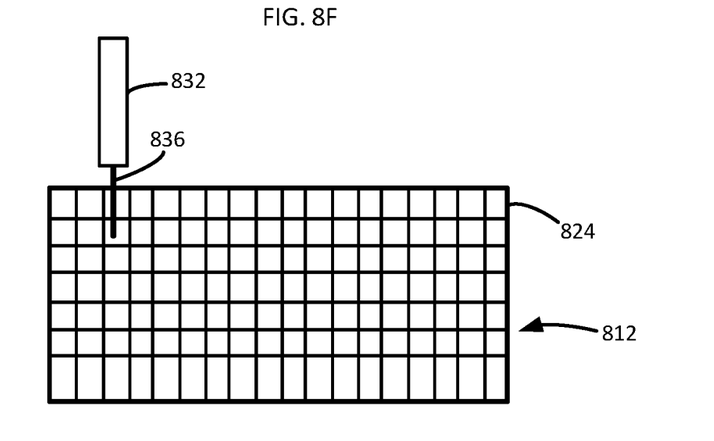

Optionally, the nanofiber structure assembly 824 on the substrate assembly 812 can be cut or shaped into any pattern, shape, or combination of shapes. FIG. 8F illustrates the cutting of the nanofiber structure assembly 824 with a laser beam 836 produced by laser diode device 832. Other cutting systems can include electric discharge devices (whether corona or electric arc (using e.g., "EDM") and heat based cutting devices. In the example of FIG. 8F, the combination of the NaCl soluble layer 816 and the infrared (IR) laser beam 836 is useful for at least the reason that NaCl is transparent to IR radiation. For this reason, the nanofiber structure assembly 824 can be cut with the laser beam 836 without heating, combusting, or otherwise degrading the soluble layer 816. Thus, unintended thermal damage and/or contamination of the nanofiber structure assembly 824 is avoided.

Figure 8G:
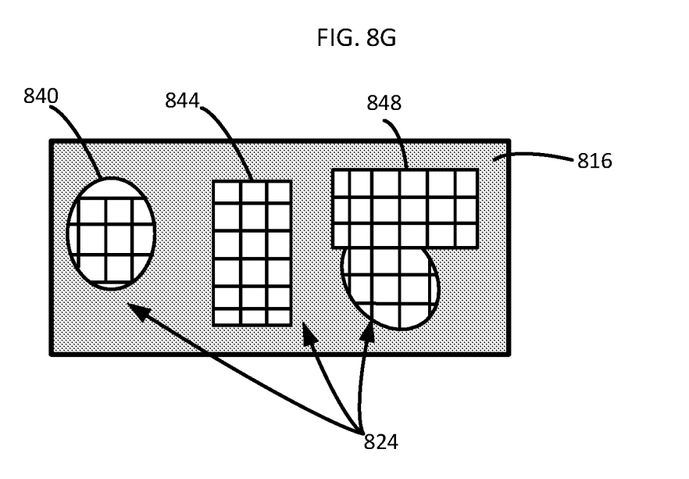

FIG. 8G illustrates example shapes into which the nanofiber structure assembly 824 has been cut. As shown, for illustration purposes only, the nanofiber structure assembly 824 has been cut into an ellipse 840, a rectangle 844, and an irregular shape 848. It will be appreciated that the nanofiber structure assembly 824 can be cut into any shape, including regular polygons, irregular polygons, annulus shapes, rings, spirals, among others. Portions of the nanofiber structure assembly 824 not in the desired shape(s) can be removed, thus exposing the soluble layer 816.

Figure 8H:
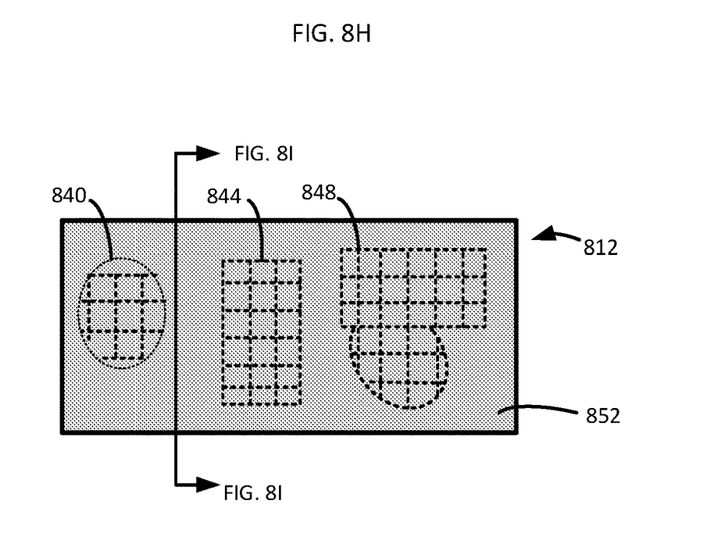
Figure 8I:
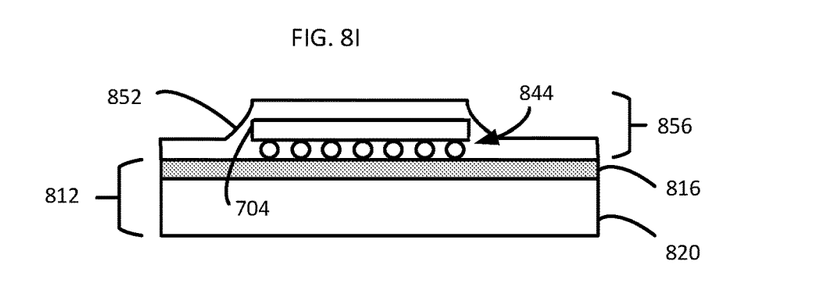
Figure 8J:
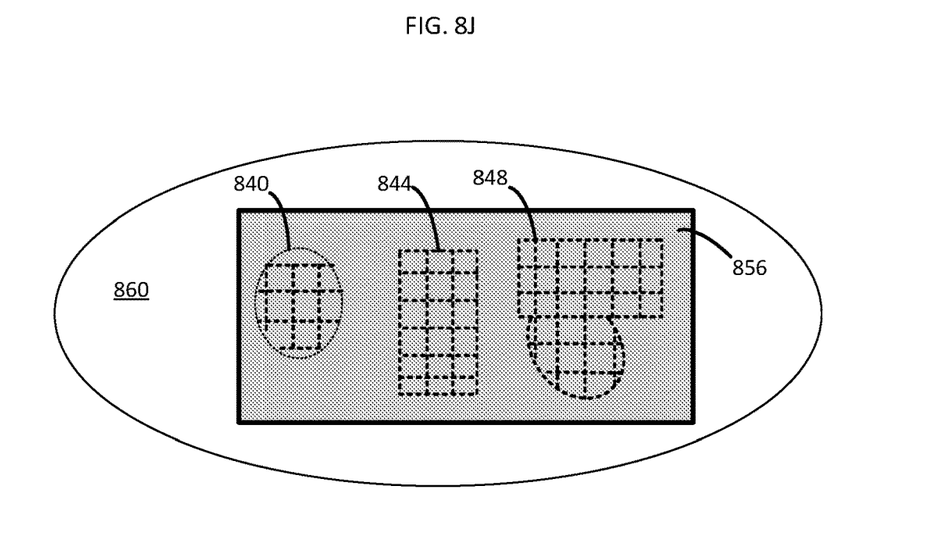
Figure 8K:
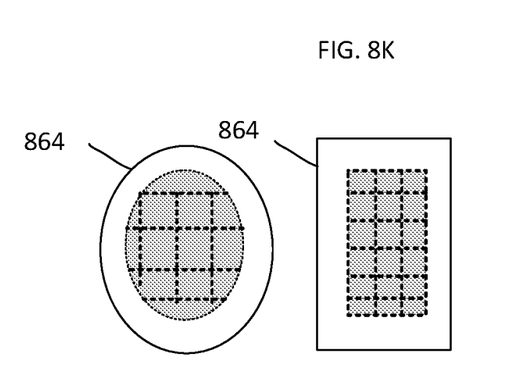

In some examples, the nanofiber structure assembly 824 can be added to by placing a nanofiber sheet, or in this case, a nanofiber film 852 over the shapes 840, 844, 848, thus forming a second nanofiber structure assembly 856. A plan view of this is shown in FIG. 8H. A cross-sectional view, taken at the location indicated in FIG. 8H, is shown in FIG. 8I.

The second nanofiber structure assembly 856 can then be removed from the substrate 820 by placing the second nanofiber structure assembly 856 in water 860 using the process shown in FIGS. 7A-7C and described above. In some examples, the second nanofiber structure assembly 856 can be allowed to reside on the on the water 860 for a period of time (e.g., 5 minutes, 30 minutes, 60 minutes, 120 minutes), so that all residual salt (or other soluble layer material) is removed from the second nanofiber structure assembly 856.

The second nanofiber structure 856 can then be removed from the water using a frame or a final substrate 864 and optionally cut into one or more of the shapes 840, 844, 848 shown above. The final substrate 864 can include any crystalline or amorphous materials (e.g., polymers, borosilicate glass, silicon, acrylic, ITO, zinc sulfide) and can be rigid or flexible. The topography of the final substrate can be flat or rounded. This assembly can be dried using heat and/or vacuum to remove any residual solvent (e.g., water).

Figure 9:
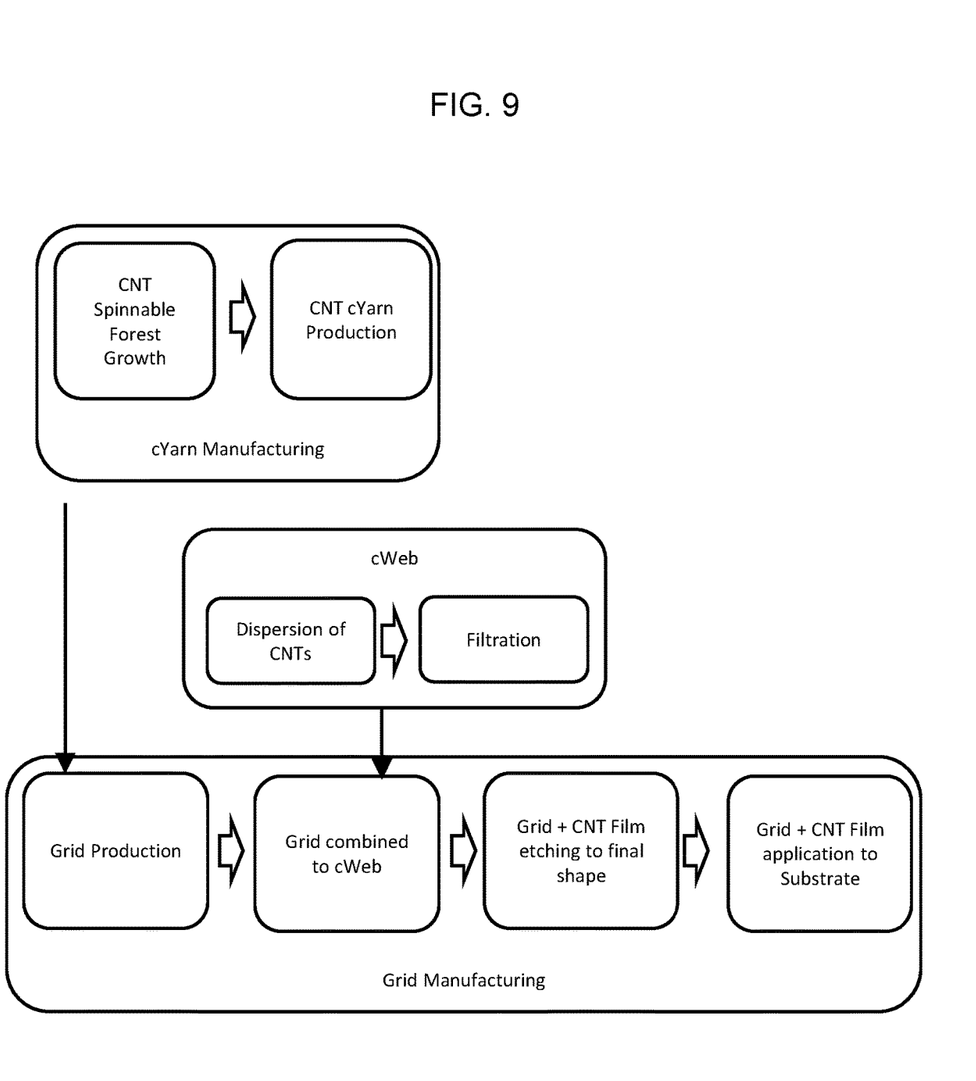
FIG. 9 illustrates a method flow diagram for an example method shown in FIGS. 8A-8K, in an embodiment.
Figure 10:
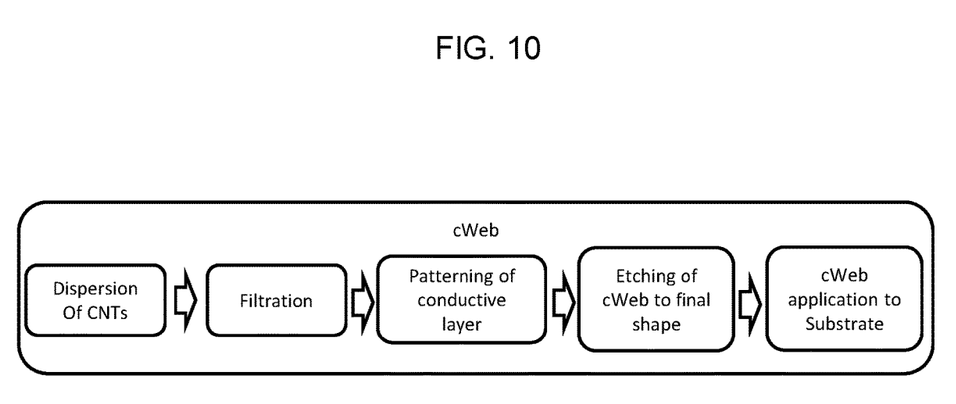
FIG. 10 illustrates a method flow diagram for an example method shown in FIGS. 8A-8K, in an embodiment.

FIGS. 9 and 10 show example method flow diagrams corresponding to embodiments of the above process.

Further Considerations

The foregoing description of the embodiments of the disclosure has been presented for the purpose of illustration; it is not intended to be exhaustive or to limit the claims to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the invention, which is set forth in the following claims.

What is claimed is:

1. A method comprising:
preparing a nanofiber structure on a substrate assembly, the substrate assembly including a substrate layer and a soluble layer;
dissolving the soluble layer with a solvent;
in response to the dissolving, floating the nanofiber structure on a surface of the solvent; and
causing detachment of the nanofiber structure from the substrate layer as the nanofiber structure is submerged into the solvent.

2. The method of claim 1, further comprising removing the floating nanofiber structure from the surface of the solvent.

3. The method of claim 1, wherein the soluble layer is sodium chloride and the solvent is water.

4. The method of claim 1, wherein the soluble layer is a polymer and the solvent is an organic solvent.

5. The method of claim 1, further comprising cutting the nanofiber structure with an infrared laser before the dissolving.

6. The method of claim 1, wherein the substrate layer comprises one or more of glass, silica, silicon, polymer, and steel.

7. The method of claim 1, wherein a thickness of the soluble layer is between 10 μm and 200 μm.

8. The method of claim 2, wherein the removing includes using a final substrate to remove the floating nanofiber structure from the surface of the solvent.

9. The method of claim 1, wherein the nanofiber structure comprises at least two carbon nanofiber layers.

10. The method of claim 9, wherein each of the carbon nanofiber layers comprise at least one of a carbon nanofiber sheet, a carbon nanofiber filtered film, and a carbon nanofiber grid.

11. The method of claim 10, further comprising floating the nanofiber structure on the solvent surface following complete detachment from the substrate layer.

12. The method of claim 2, wherein the removing includes using a frame to lift the floating nanofiber structure from the surface of the solvent.

13. The method of claim 12, wherein the frame is a wire frame comprising an open center portion.

14. An apparatus, comprising:
a transparent conductive film comprising:
a nanofiber structure on a substrate assembly, the substrate assembly including a substrate layer and a soluble layer;
wherein the nanofiber structure is configured to float on a surface of a solvent and wherein the soluble layer is configured to be dissolved from the substrate layer by floating the nanofiber structure on the surface of the solvent.

15. The apparatus of claim 14, wherein an electrical resistance of the transparent conductive film is less than 1 Ω/sq.

16. The apparatus of claim 14, wherein the transparent conductive film is transparent to greater than 99% of visible light.

17. The apparatus of claim 14, wherein the soluble layer comprises at least one of sodium chloride, calcium chloride, potassium bromide, starch, polystyrene, and toluene.

18. The apparatus of claim 14, wherein the transparent conductive film is configured to be cut using at least one of a laser beam and an electric discharge device without causing damage to the soluble layer.

19. The apparatus of claim 14, wherein the nanofiber structure comprises at least two carbon nanofiber layers.

20. The apparatus of claim 19, wherein each of the carbon nanofiber layers comprise at least one of a carbon nanofiber sheet, a carbon nanofiber filtered film, and a carbon nanofiber grid.

* * * * *